US007591574B2

(12) United States Patent
Eschbach

(10) Patent No.: US 7,591,574 B2
(45) Date of Patent: Sep. 22, 2009

(54) OPTICAL ELEMENT FOR VARIABLE MESSAGE SIGNS

(75) Inventor: Bernd Eschbach, Karlsruhe (DE)

(73) Assignee: Dambach-Werke GmbH, Kuppenheim (DE)

( * ) Notice: Subject to any disclaimer, the term of this patent is extended or adjusted under 35 U.S.C. 154(b) by 159 days.

(21) Appl. No.: 11/236,901

(22) Filed: Sep. 28, 2005

(65) Prior Publication Data

US 2006/0077661 A1 Apr. 13, 2006

(30) Foreign Application Priority Data

Sep. 30, 2004 (EP) .................................. 04023304

(51) Int. Cl.
*F21V 7/04* (2006.01)
*F21V 5/00* (2006.01)
*H01L 33/00* (2006.01)
*B64D 47/06* (2006.01)
*G09F 13/18* (2006.01)

(52) U.S. Cl. ....................................... 362/555; 362/559

(58) Field of Classification Search ................. 362/555, 362/559

See application file for complete search history.

(56) References Cited

U.S. PATENT DOCUMENTS 2,282,167 A * 5/1942 Cullman ..................... 362/188
4,266,534 A * 5/1981 Ogawa ........................ 362/574
4,779,967 A 10/1988 Murphy et al.
6,239,421 B1 * 5/2001 Nagata et al. ............... 362/581
6,550,952 B1 * 4/2003 Hulse et al. ................. 362/555
7,217,022 B2 * 5/2007 Ruffin ........................ 362/555

FOREIGN PATENT DOCUMENTS

EP 0 930 600 7/1999
WO WO2004/068447 8/2000

* cited by examiner

*Primary Examiner*—Sandra L O'Shea
*Assistant Examiner*—William J Carter
(74) *Attorney, Agent, or Firm*—Jansson Shupe & Munger Ltd.

(57) ABSTRACT

An optical element for variable message signs includes an oblong housing, in which at least one light source as well as at least first and second lenses are arranged successively in the longitudinal direction of the housing. The lenses serve for defining the beam path of the light emitted by the light source in the irradiation direction, wherein the lens arranged closer to the light source is formed as a converging lens, and the lens arranged farther away from the light source is formed as a rod lens.

4 Claims, 6 Drawing Sheets

OPTICAL ELEMENT FOR VARIABLE MESSAGE SIGNS

RELATED APPLICATION

This application claims the benefit of EP 04 023 304.1, filed Sep. 30, 2004, the contents of which are incorporated herein.

FIELD OF THE INVENTION

The present invention refers to an optical element for variable message signs.

Variable message signs serve in many places for regulating the road traffic in that, depending on the traffic density and given general conditions, they are capable of displaying certain road signs that may be shown as symbols or characters. A variable message sign is equipped with a matrix-like arrangement of optical elements which compose the overall display. A light point corresponds to each optical element, wherein said light point is supposed to be perceived by the driver from a far distance so that the road traffic can safely be guided.

The invention relates to a cooling device for preferably large-format units which are to be cooled and which have a high thermal dissipation.

BACKGROUND OF THE INVENTION

Strict standards were set for light distribution in the field of traffic technology which can be achieved by providing lens arrangements arranged in front of the illuminants. Signal optics with lens arrangements have therefore been known for a long time, see e.g. DE 42 25 139 A1, in which a converging lens and a dispersing lens are arranged in front of an illuminant to achieve the desired light distribution.

In the meantime light diodes have become accepted as illuminants in variable message signs, which, as is known, have a long life and provide a high intensity of light. An essential aspect is the phantom light, i.e. sunlight impinging onto the LED, which is reflected by the LED and which may lead to deceptions to the road users when the position of the sun is unfavorable. For this, legal regulations exist that must be obeyed in the sense of traffic safety.

EP 0 930 600 A1 is an example for an optical element in variable message signs, in which the problem of phantom light is explicitly discussed. In this device, the light irradiated by an LED is bundled by a converging lens and is conducted to a dispersing lens arranged at a distance to the converging lens. By a suitable design of the converging lens, the light may be distributed according to the demands. The disadvantage is the large distance between the converging lens and the dispersing lens that is necessary to avoid phantom light as well as the factual necessity to arrange a screen in the area of the focal spot of the converging lens so that the relevant regulations for light distribution and phantom light are fulfilled.

In order to further increase brightness of the light emitting diodes, the LEDs are permanently improved, e.g. by an improved reflection of the light which is actually emitted backwards. This was most of all achieved by the use of modern reflectors within the LEDs so that extremely powerful LEDs are available nowadays. When using modern LEDs the potentially higher phantom light must be prevented by suitable measures.

SUMMARY OF THE INVENTION

Thus, it is the object of the present invention to provide an optical element for variable message signs which provides a very high luminosity in the desired ranges, wherein at the same time all regulations with respect to phantom light are fulfilled and the space consumption is held as low as possible with a simple and cost-effective structure.

The optical element for variable message signs according to the invention includes an oblong housing, in which at least one light source and at least first and second lenses are arranged successively in the longitudinal direction of the housing, wherein the first and second lenses serve for defining the beam path of the light emitted by the light source in the irradiation direction, and wherein the first lens arranged closer to the light source is formed as a converging lens. The optical element according to the invention is characterized in that the second lens arranged farther remote from the light source is formed as a rod lens. While keeping a simple geometry, a cost-effective possibility is created by fulfilling all legal regulations concerning light distribution and phantom light to create a small dimensioned and extremely luminous arrangement.

A light entry surface of the rod lens has in the horizontal direction a first radius, which in the vertical direction merges into a usually larger radius or a planar surface so that when light rays pass through, a stronger bundling of the light rays and thus a deflection of the light bundle at a shorter distance to the converging lens takes place in the horizontal direction in comparison with the vertical direction.

The light outlet surface of the rod lens advantageously includes a spherical or aspherical optical form surface, which ensures a scattering of the emerging light into a predetermined angular range so that the road users can easily perceive the traffic signal both from a relatively far distance and in the vicinity of the message sign.

The converging lens and the light entry surface of the rod lens are preferably formed such that light rays emitted by the light source intersect within the rod lens between the light entry surface and the light emerging surface, whereby a higher luminosity is achieved in the field of vision.

The housing preferably includes a first housing portion, in which the light source and the converging lens are attached, and a second housing portion in which the rod lens is attached. This facilitates assembly of the individual elements.

The first housing portion is plugged onto the second housing portion, wherein a cavity formed in a front portion of the first housing portion accommodates the second housing portion. This arrangement provides an especially stable support of the lens system also in the case of oscillations.

To reduce the phantom light, the rod lens may have a bevelled surface in a lower portion towards the light entry surface, said surface being capable of being used either individually or in combination with further elements for suppressing stray light.

The light entry surface of the rod lens preferably abuts at a lower portion on a projection, which prevents stray light from reaching the LED reflector, whereby a defined distance between the optical elements is guaranteed and it is ensured that even almost horizontally impinging sun light hardly produces any phantom light.

Advantageously, an outer screen is arranged in the outer upper end portion of the second housing portion, said outer screen further minimizing an impingement of sun light into the optical lens system.

A variable message sign according to the invention is equipped with a front plate, which includes several accommodation holes, in which the optical elements according to the invention are attached. Variable message signs of this type are extremely luminous and fulfil the requirements regarding light distribution and phantom light behaviour.

Further details, features and advantages of the present invention can be derived from the following description with reference to the drawings.

BRIEF DESCRIPTION OF THE DRAWING FIGURES

DETAILED DESCRIPTION OF PREFERRED EMBODIMENTS

Figure 1:
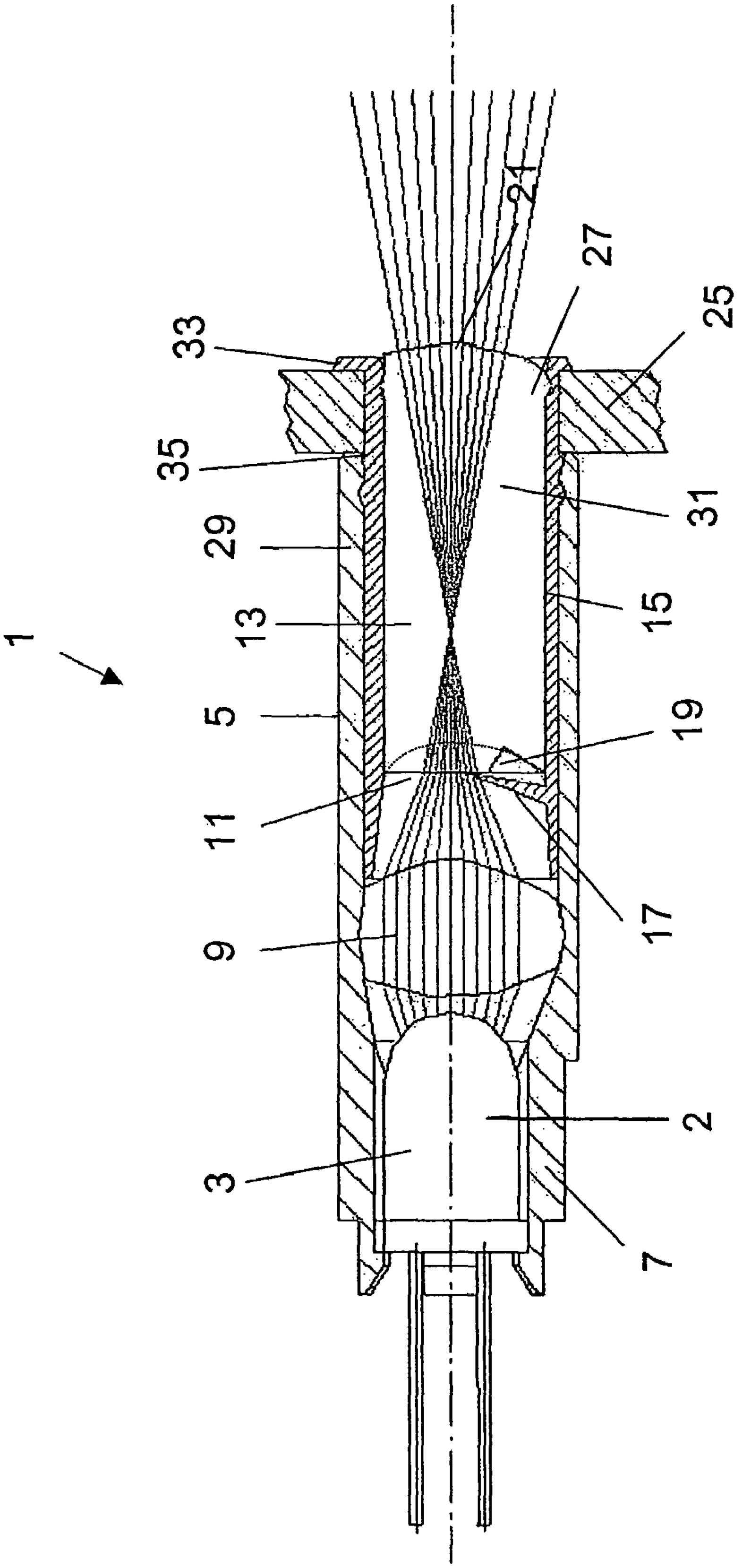
FIG. 1 shows a longitudinal section through an optical element according to the invention including the beam path provided.
Figure 2:
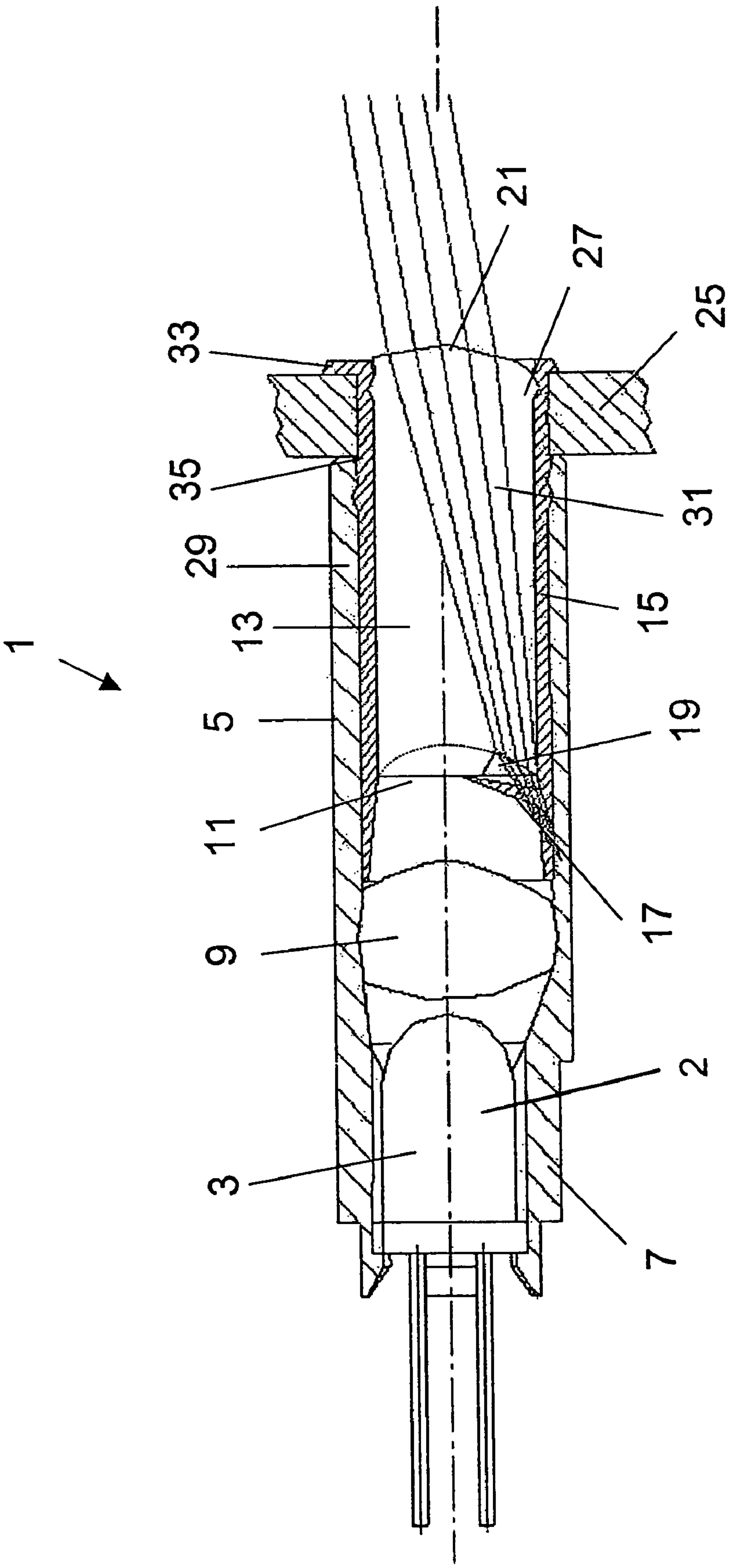
FIG. 2 shows the view of FIG. 1 when the sun light impinges almost horizontally.
Figure 3:
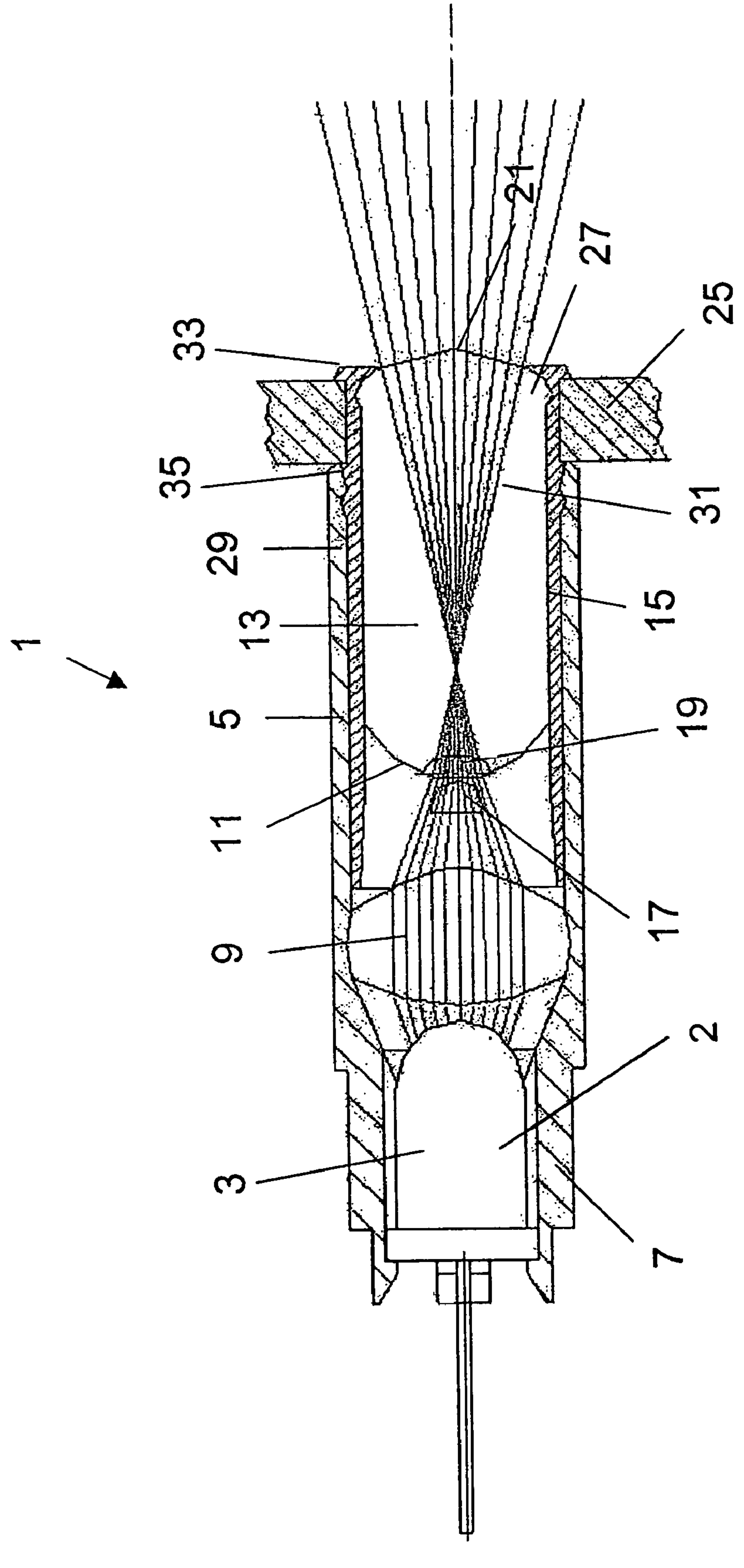
FIG. 3 shows a sectional top view of the optical element of FIG. 1 along the horizontal central plane of the arrangement.
Figure 4:
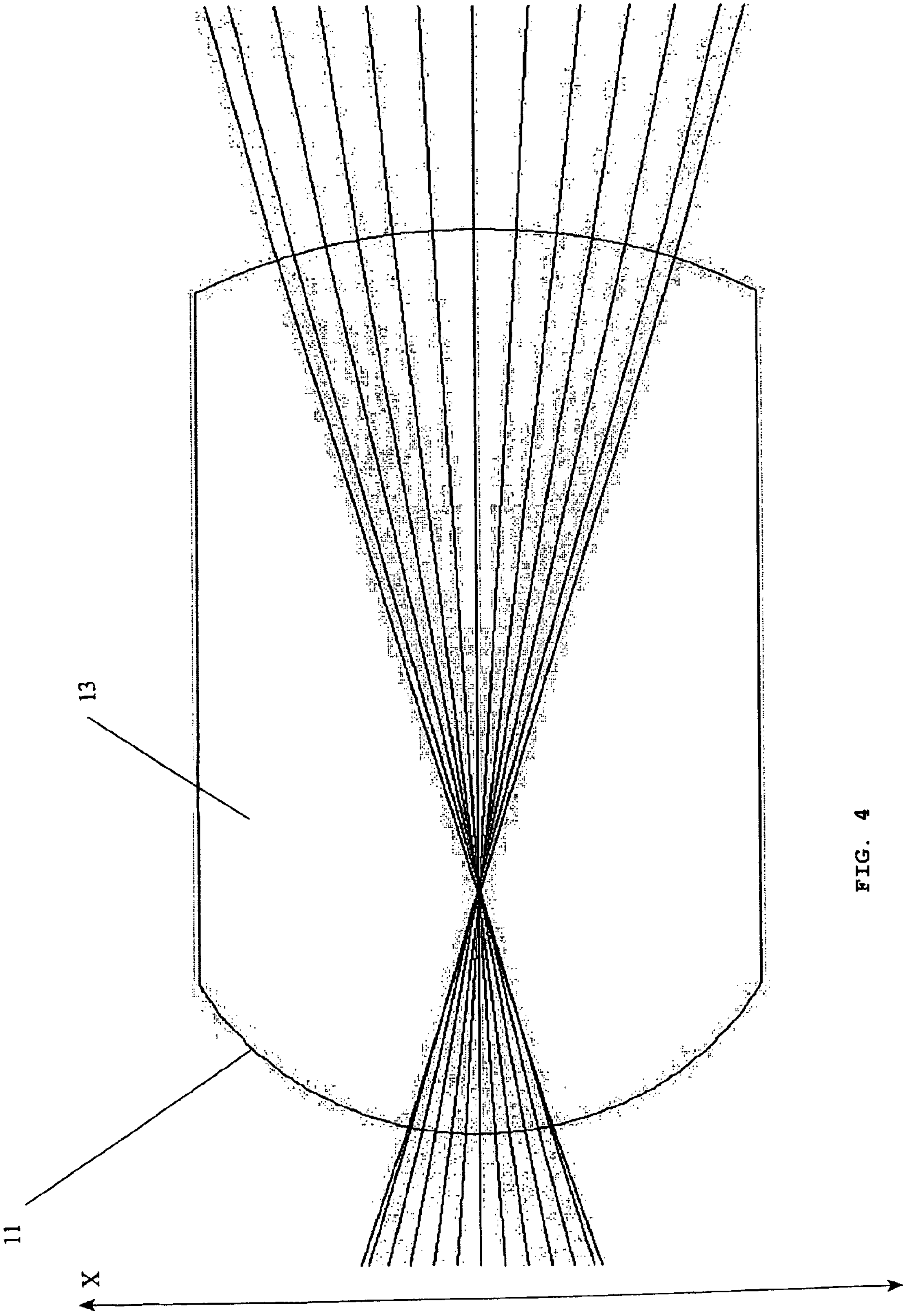
FIGS. 4-6 illustrate the beam path of the optical element according to the invention.
Figure 5:
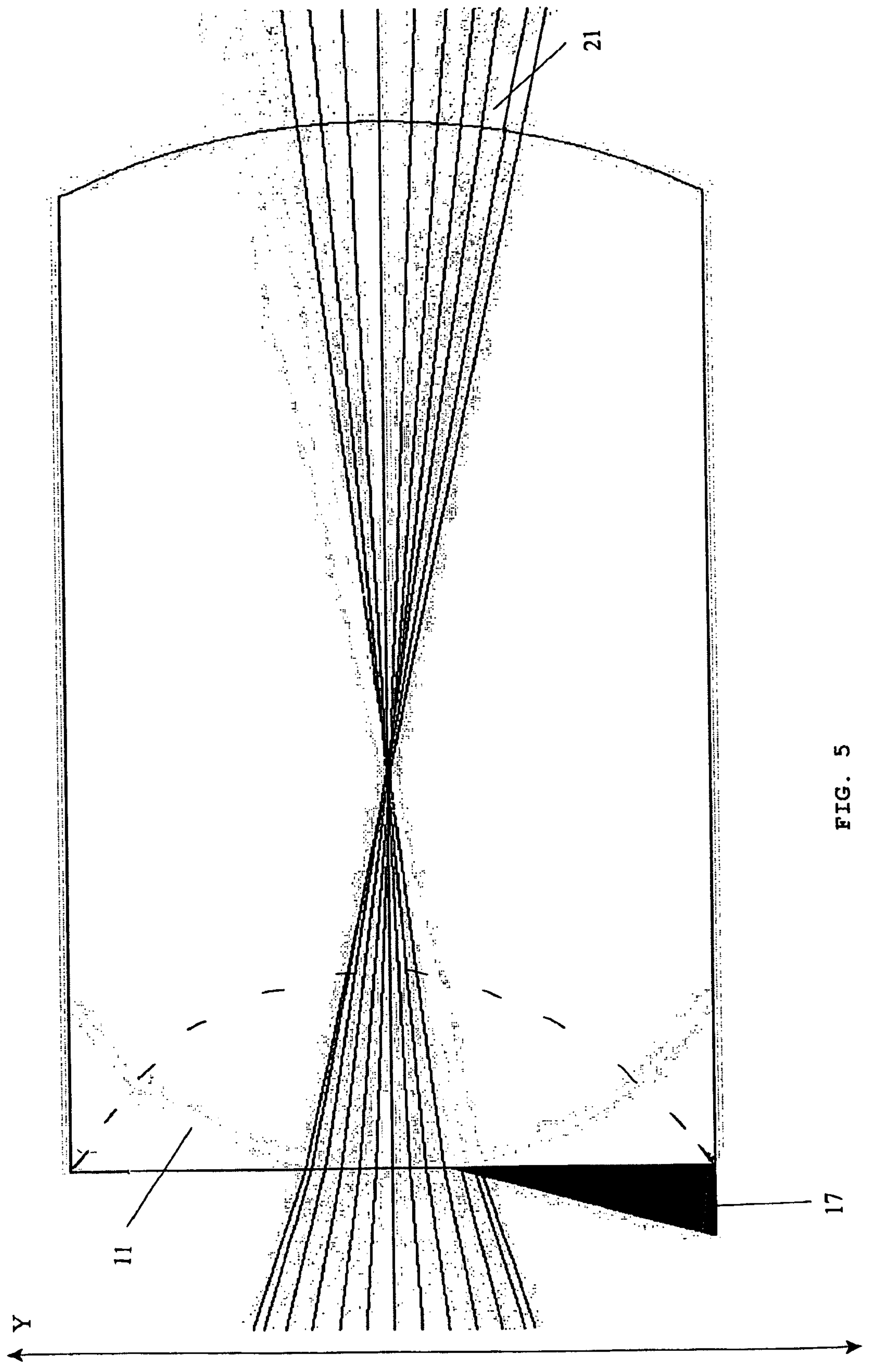
Figure 6:
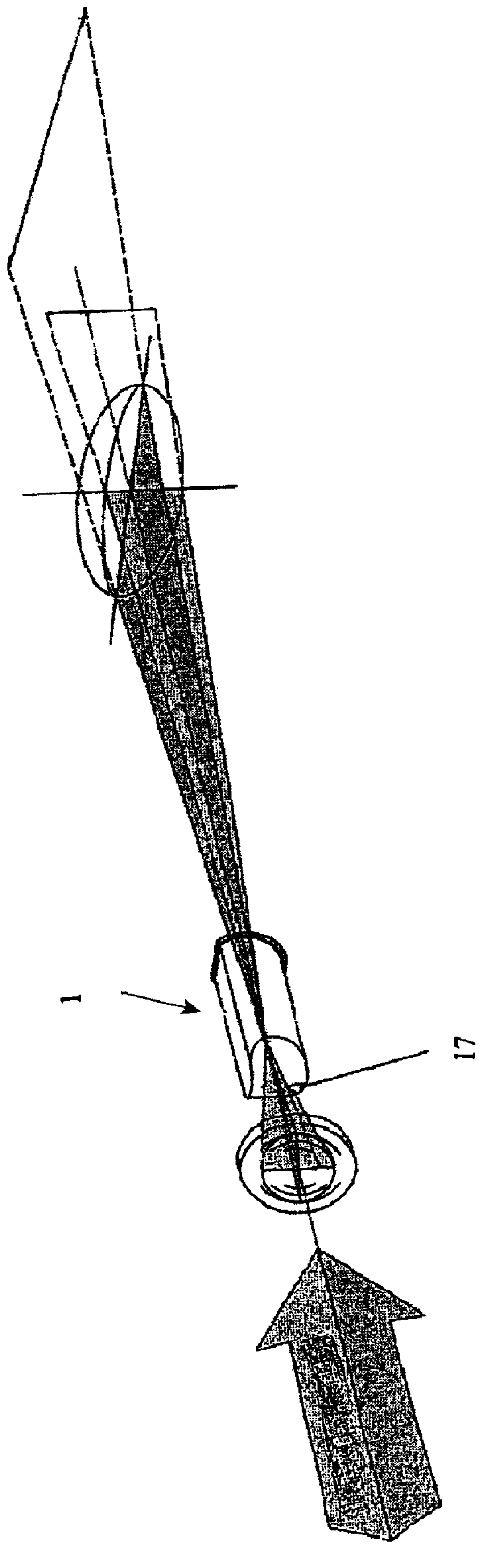

FIGS. 1 and 2 show the elements of the optical element for variable message signs according to the invention in a longitudinal section, and FIG. 3 shows them from the top in a cross section along the horizontal central plane of the arrangement. The optical element 1 has a light source 2, which is preferably formed as a light emitting diode (LED). The LED 3 provided with the usual terminals is accommodated and attached in a first oblong housing portion 5 close to the rear end 7 thereof. It is also possible to use LEDs mounted on printed circuit boards as illuminants. Moreover, a converging lens 9 is arranged in front of the LED 3 in the first housing portion 5 at a relative short distance to the LED 3, said converging lens bundling the light emitted by the LED 3 and further conducting it to a light entry surface 11 of a rod lens 13. The rod lens 13 is accommodated and fixed in a second oblong housing portion 15, wherein the light entry surface 11 of the rod lens 13 when inserting same into the second housing portion 15 abuts in a lower portion on a projection 17, which is preferably formed integrally with the second housing portion 15 and which projects inwards in a tongue-like manner. The projection 17 therefore serves for the precise positioning of the rod lens 13 in the second housing portion 15 and at the same time prevents stray light. It may absorb the light rays emerging in the lower portion of the converging lens 9 and it may absorb sun light impinging into the optics according to the invention and leaving the rod lens 13 in the lower portion through the light entry surface 11, as may be seen from FIG. 2. In the lower portion the rod lens 13 further includes in the direction of the light entry surface 11 a bevelled surface 19, which also serves for deflecting light impinging at a low angle.

The light entry surface 11 of the rod lens 13 is formed such that different ray bundling angles and thus different irradiation angles can be realized in the horizontal and in the vertical plane. It particularly includes a first radius in the horizontal direction, which in the vertical direction merges into a second, usually larger radius or a planar surface, so that in the case of passing light rays, a greater bundling and a deflection of the light bundle in a shorter distance from the converging lens takes place in the horizontal direction compared to the vertical direction.

In interaction with the converging lens 9, the light entry surface 11 is responsible, due to the geometry, for the fact that the light rays emitted by the light source 3 intersect within the rod lens 13 and are conducted to the light emerging surface 21 of the rod lens 13. The light emerging surface 21 of the rod lens 13 is formed such that the light coming from the light entry surface 11 is emitted towards the desired angular range in the vertical and in the horizontal direction. Thus, the desired light distribution is achieved in the irradiation area by a suitable design combination of the light entry surface 11 and the light emerging surface 21 of the rod lens 13.

The second housing portion 15 may also include an outer screen (not shown) in the outer upper end portion, said outer screen preventing a priori an impingement of sun light having more than a certain angle of inclination with respect to the horizontal. Usually, the outer screen, the bevelled surface 19 and the projection 17 acting as an inner screen may collectively be used, however, it is also conceivable to refrain from using one of the three elements and still achieve suitable parameters. On the whole, an aspherical irradiation is to be achieved, where no or only a small upward emission of light takes place, which leads to the advantage of a light distribution only towards the direction visible by the road user. By changing the radius of the light emerging surface 21 the irradiation angle can also be made smaller or be enlarged.

In a variable message sign a plurality of such optical elements 1 is contained. The figures show a front plate 25 which includes accommodation holes 27 in which the optical elements 1 are inserted and fixed.

The structure of the housing of the optical element 1 according to the invention as well as the installation thereof in a front plate 25 of a variable message sign shall be explained.

First of all, the LED 3 and the converging lens 9 are inserted into a rear portion 7 of the first housing portion 5 and they are fixed therein, wherein a first cavity 31 remains in a front portion 29 of the first housing portion 5, said cavity substantially corresponding to the size of an accommodation hole 27. Moreover, the rod lens 13 is inserted into the second housing portion 15 up to the abutment at the projection 17 and it is fixed there. Subsequently, the second housing portion 15 is pressed from the front into the accommodation hole 27, wherein angular projections 33 substantially being bent outwards perpendicular from the front end of the second housing portion 15, limiting the insertion when they abut at the front plate 25. The accommodation hole 27 and the second housing portion 15 are formed in a manner, e.g. flattened on one side, that the installation position of the lens system is fixed. Moreover, the system can be formed especially water-proof if the accommodation openings have a slightly conical shape and grooves 35 are provided on the outer side of the second housing portion 15, which are squeezed together when being pressed into the front plate 25.

After pressing the second housing portion 15 into the front plate 25, the first housing portion 5 is plugged from the rear side onto the second housing portion 15 and is locked there by suitable means. To improve stability it is suitable if the first housing portion 5 reaches to the front plate 25. Caused by the precise manufacture of the individual components and the engagement of the housing portions, the distances of the lenses 9 and 13 with respect to one another and their spatial orientation are precisely defined.

Thus, a luminous, modularly composed optical element was created, which ensures an especially effective light distribution with low phantom light and which can at the same time be easily installed in a variable message sign.

I claim:

1. An optical element comprising an oblong housing within a variable traffic sign in which at least one light source as well as at least two lenses are successively arranged in a longitudinal direction of the housing wherein:

the lenses serve to define a beam path of the light emitted by the light source in an axial direction, and said lens arranged closer to the light source is a converging lens;

said lens arranged farther from the light source is a rod lens;

a light-entry surface of the rod lens has a first radius in a horizontal direction, said radius merging in a vertical direction into a second, larger radius or into a planar surface, so that passage of light rays experience a stronger bundling and a deflection of a light bundle at a shorter distance from a converging lens in the horizontal direction compared to the vertical direction;

the rod lens is configured to emit light from a light emerging surface which is located on an end of the oblong housing opposite the light source, wherein light only exits the rod lens through the light emerging surface which is located opposite the light-entry surface, the light emerging surface has a spherical or aspherical optical form surface which ensures a scattering of the emerging light into a predetermined angular range; and the rod lens comprises a beveled surface in a lower portion in the direction of the light-entry of the light emitted by the light source, said beveled surface deflecting a majority of stray light entering an end of the rod lens opposite the light source from beyond the light emerging surface, which prevents stray light from reaching the light source.

2. The optical element for variable traffic signs of claim 1 wherein the converging lens and the light-entry of the rod lens are formed such that light rays emitted by the light source intersect within the rod lens between the light-entry surface and the light emerging surface and light is emitted from the light emerging surface.

3. The optical element for variable traffic signs of claim 1 wherein the housing has a first housing portion in which the light source and the converging lens are attached and a second housing portion in which the rod lens is attached.

4. The optical element for variable traffic signs of claim 3 wherein the first housing portion is plugged onto the second housing portion, a cavity is formed in a front portion of the first housing portion to accommodate the second housing portion.

* * * * *